(12) United States Patent
Weintraub

(10) Patent No.: US 6,597,213 B1
(45) Date of Patent: Jul. 22, 2003

(54) CASCADABLE FREQUENCY DOUBLER HAVING STABLE OPERATION OVER VARIED MANUFACTURING PROCESSES AND ENVIRONMENTAL OPERATING CONDITIONS

(75) Inventor: Sharon Lynn Weintraub, Encinitas, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 10/114,835

(22) Filed: Apr. 3, 2002

(51) Int. Cl.[7] ............................................. H03B 19/00
(52) U.S. Cl. ................ 327/122; 327/117; 327/119; 327/262; 327/269; 327/277; 327/298
(58) Field of Search ................ 327/122, 115, 327/116, 119, 262, 263, 269, 270, 271, 276, 277, 284, 297, 298, 299

(56) References Cited

U.S. PATENT DOCUMENTS

| | | | | |
|---|---|---|---|---|
| 4,637,018 A | * | 1/1987 | Flora et al. ................ 371/1 |
| 5,185,768 A | * | 2/1993 | Ferraiolo et al. ........... 377/47 |
| 5,963,071 A | * | 10/1999 | Dowlatabadi ............... 327/175 |
| 6,025,745 A | * | 2/2000 | Lee et al. .................. 327/277 |
| 6,091,270 A | * | 7/2000 | Cauchy ...................... 327/122 |
| 6,104,223 A | * | 8/2000 | Chapman et al. ........... 327/276 |
| 6,359,483 B1 | * | 3/2002 | Watkins et al. ............. 327/158 |

\* cited by examiner

Primary Examiner—Timothy P. Callahan
Assistant Examiner—An T. Luu
(74) Attorney, Agent, or Firm—Gray Cary Ware & Freidenrich; Terrance A. Meador

(57) ABSTRACT

A digital frequency doubler circuit employs a stable reference clock signal, delayed by a reference delay line, to obtain information related to delay characteristics of a matching input delay line. An input clock signal is delayed by the input delay line, which provides a plurality of variously delayed input clock signals based upon the input clock signal. The reference delay line provides a plurality of variously delayed reference clock signals based upon the stable reference clock signal; the delayed reference clock signals convey information related to the operating characteristics of both delay lines. In response to such information, one of the delayed input clock signals can be selected as a delayed clock output. The reference and input delay lines are configured such that the delay circuit consistently generates a delayed clock output having an actual delay that falls within a specified range of delay. The frequency doubled output clock signal is derived from the delayed clock signal output and the original input clock signal using an XOR element.

23 Claims, 11 Drawing Sheets

CASCADABLE FREQUENCY DOUBLER HAVING STABLE OPERATION OVER VARIED MANUFACTURING PROCESSES AND ENVIRONMENTAL OPERATING CONDITIONS

CROSS REFERENCE TO RELATED APPLICATIONS

The subject matter disclosed herein is related to the subject matter disclosed in U.S. patent application Ser. No. 10/1115,359, titled "PRECISION DIGITAL DELAY ELEMENT HAVING STABLE OPERATION OVER VARIED MANUFACTURING PROCESSES AND ENVIRONMENTAL OPERATING CONDITIONS."

FIELD OF THE INVENTION

The present invention relates generally to digital circuits. More particularly, the present invention relates to a digital frequency doubler circuit that compensates for practical variations in manufacturing processes and operating conditions.

BACKGROUND OF THE INVENTION

Many digital circuits utilize a frequency doubler that doubles the rate of a digital clock signal. Digital frequency doublers may utilize delay elements designed to delay a digital signal by either an absolute amount or by a defined fraction of its clock period. For example, if a clock signal with a period of 3.2 nanoseconds needs to be frequency doubled, the clock signal can be buffered to generate a delay of 800 picoseconds, then the original clock signal and the delayed clock signal can be subjected to an XOR operation, thus creating a waveform with a period of 1600 picoseconds and a high time of 800 picoseconds. In this regard, the original clock signal should be delayed with an appropriate number of buffers to arrive at a nominal delay of 800 picoseconds. In real world applications, however, variations in process, temperature, voltage, and other environmental conditions can result in an actual delay that ranges between 500 picoseconds to 1100 picoseconds. This would result in an output clock signal having a duty cycle within the range of 31% to 69%, rather than the desired 50% duty cycle.

One known solution to the above problem is to design the downstream circuitry to accommodate the worst case duty cycle. For example, a practical application may utilize relatively high powered flip flop devices that are capable of tolerating a wider range in clock signal duty cycle. Unfortunately, this solution results in an inefficient, riskier, and higher powered design.

Another prior art approach utilizes a high speed shift register to delay an external clock signal. This solution typically requires a relatively high amount of operating power, and it introduces the problem of metastability (the metastability issue can be addressed at the expense of additional operating power).

Accordingly, it would be desirable to have a digital frequency doubling circuit that generates a frequency doubled clock signal having a relatively narrow range of duty cycles across a variety of process and/or environmental conditions.

BRIEF SUMMARY OF THE INVENTION

A digital frequency doubling circuit according to the present invention compensates for variations in process and environmental conditions by using a stable reference clock signal and two matched delay line elements. The frequency doubling circuit is capable of generating a frequency doubled clock signal having a nominal duty cycle and within narrow tolerances relative to conventional frequency doubling circuits.

The above and other aspects of the present invention may be carried out in one form by a method for altering the frequency of a digital clock signal. The method involves: applying a reference clock signal to a reference delay element; applying an input clock signal to an input delay element, where the reference delay element and said input delay element having matching operational characteristics; obtaining, from the reference delay element, information identifying delay characteristics of the reference delay element; generating a delayed clock signal, based upon the input clock signal, in response to the information; and deriving an output clock signal from the delayed clock signal and the input clock signal. The derived output clock signal has a higher frequency than said input clock signal.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. For example, the present invention may employ various integrated circuit components, e.g., memory elements, clock elements, logic elements, look-up tables, and the like, which may carry out a variety of functions under the control of one or more microprocessors or other control devices. In addition, those skilled in the art will appreciate that the present invention may be practiced in conjunction with any number of applications and that the structures and features described herein can be physically realized in a variety of forms.

It should be appreciated that the particular implementations shown and described herein are illustrative of the invention and its best mode and are not intended to otherwise limit the scope of the invention in any way. Indeed, for the sake of brevity, conventional techniques related to clock generation, data latching, multiplexing, data transmission, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

Figure 1:
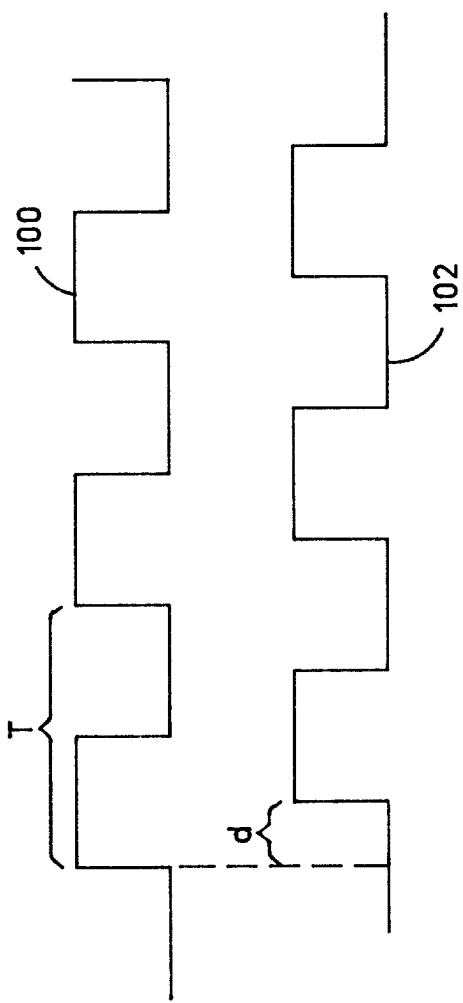
FIG. 1 is a timing diagram depicting a clock signal and a corresponding delayed clock signal.

Any number of practical applications may require a digital delay circuit or component. For example, a digital circuit may be required to delay a clock signal by a predetermined amount. In this context, FIG. 1 is a timing diagram depicting a clock signal 100 and a corresponding delayed clock signal 102. Although not a requirement of the present invention, clock signal 100 has a 50% duty cycle. Clock signal 100 is periodic with a period of T seconds. Delayed clock signal 102, which may be based upon clock signal 100, also has a 50% duty cycle and a period of T seconds. Delayed clock signal 102 is depicted with a delay of d seconds, relative to clock signal 100.

In the following example embodiment, T=3.2 nanoseconds and the desired delay (d) is 800 picoseconds. In many practical applications, the delay circuit must maintain the nominal delay plus or minus a specified tolerance. In the example embodiment, a tolerance of ±100 picoseconds is presumed, thus resulting in a tolerable delay range of 700–900 picoseconds. Of course, the specific numerical design values, empirical values, and other quantities set forth herein relate to the example embodiment. These quantities can vary from application to application, and the present invention is not limited to any specific implementation.

Figure 2:
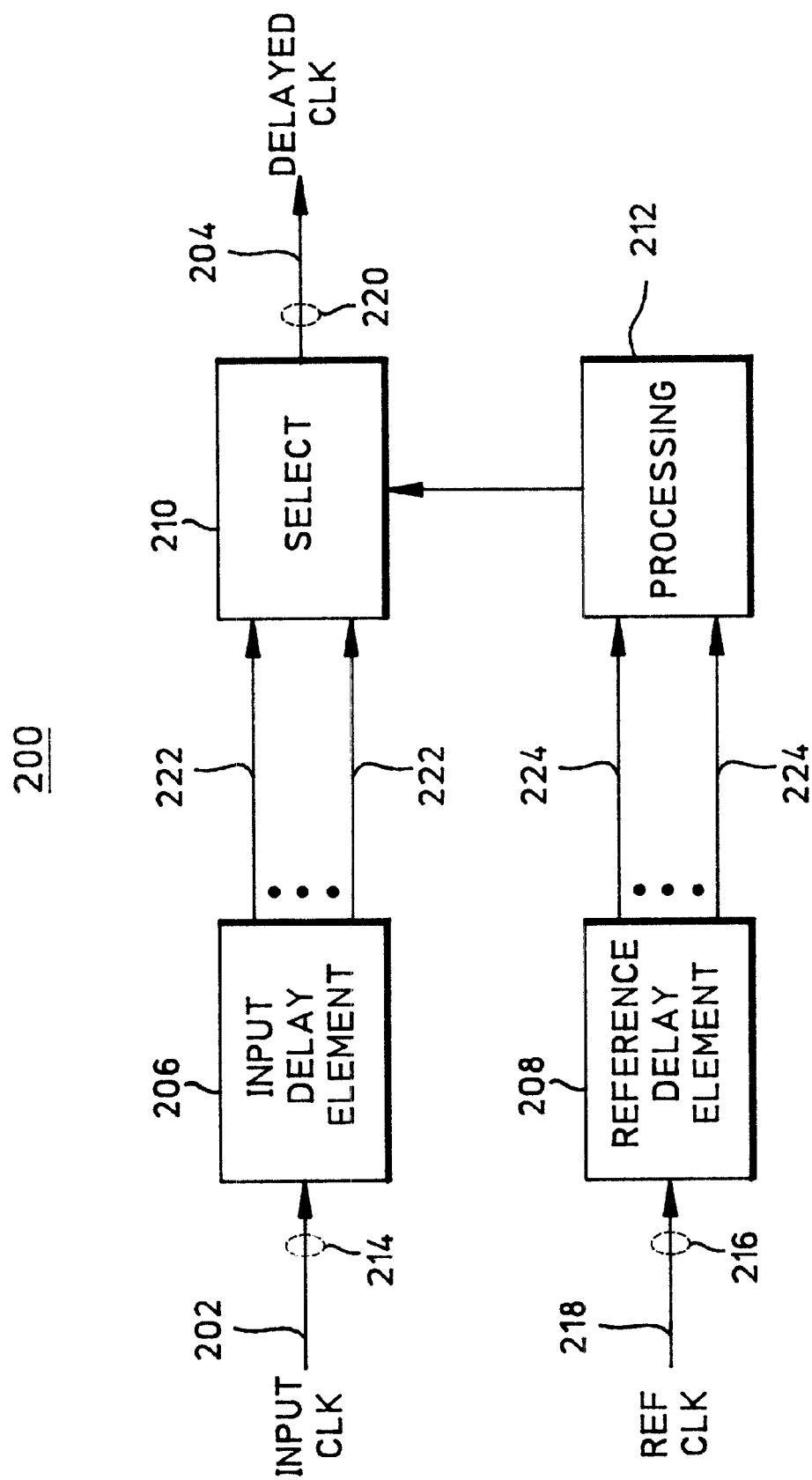
FIG. 2 is a schematic representation of a digital delay circuit configured in accordance with the present invention.

FIG. 2 is a schematic representation of a digital delay circuit 200 configured in accordance with the present invention. Circuit 200 receives an input clock signal 202 (from any suitable internal or external source), delays input clock signal 202, and produces a delayed clock signal 204 based upon input clock signal 202. Ideally, circuit 200 would consistently delay clock signal 202 by a nominal delay value, regardless of environmental operating conditions and regardless of manufacturing process variations related to the physical device that implements circuit 200. In a practical embodiment, however, circuit 200 delays clock signal 202 by approximately the nominal delay value. In other words, in practice, the actual delay of delayed clock signal 204 may fall within a specified range of delay values.

Circuit 200 generally includes an input delay element 206, a reference delay element 208, a selection circuit or component 210, and a processing circuit or component 212. Input delay element 206 is coupled (directly or indirectly) to selection circuit 210, and reference delay element 208 is coupled (directly or indirectly) to processing circuit 212. Processing circuit 212 is also coupled (directly or indirectly) to selection circuit 210; consequently, selection circuit 210 is coupled to reference delay element 208 via processing circuit 212. Input delay element 206 includes an input node or port 214 for receiving input clock signal 202, reference delay element 208 includes an input node or port 216 for receiving a reference clock signal 218, and selection circuit 210 includes an output node or port 220 for delayed clock signal 204.

Figure 3:
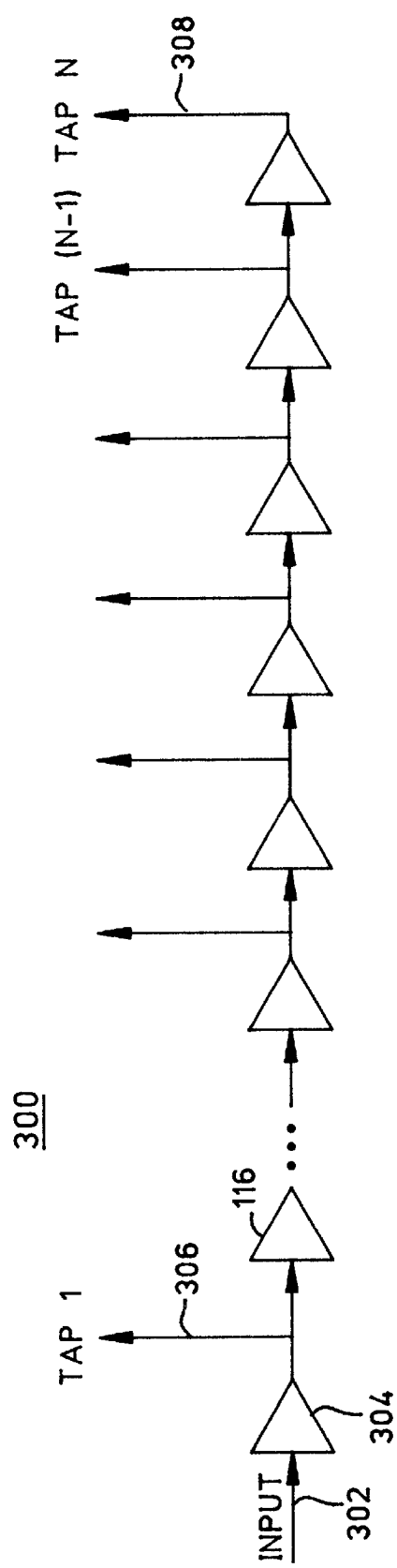
FIG. 3 is a schematic representation of a delay line element that may be utilized by the circuit shown in FIG. 2.

In a practical embodiment, input delay element 206 and reference delay element 208 are each realized as a digital delay line. In this regard, FIG. 3 is a schematic representation of a delay line 300 that may be utilized by digital delay circuit 200. Delay line 300 may be configured in accordance with conventional delay line designs. For example, delay line 300 includes a plurality of delay buffers connected in series. A digital input signal 302 is applied to a first delay buffer 304, which delays input signal 302 by an incremental amount. Each subsequent delay buffer in delay line 300 contributes to the overall delay of input signal 302 (in the preferred practical embodiment, all of the delay buffers in delay line 300 incrementally delay input signal 302 by the same nominal amount). For purposes of the numerical example described herein, each delay buffer has a nominal delay of 40 picoseconds, and the actual range of delay per buffer may vary with process and environmental variations. Delay line 300 may include any number of delay buffers; FIG. 3 depicts a generalized embodiment having N delay buffers.

Delay line 300 may include up to N delay taps corresponding to the delay buffers. In a practical embodiment, delay line 300 includes N delay taps (one for each of the N delay buffers). As shown in FIG. 3, a delay tap represents the output of a respective delay buffer. In this regard, a delay tap may be realized as an output node or port of delay line 300 and/or as an internal connection or transition point within delay line 300. As described in more detail below, a digital delay circuit according to the present invention need not utilize all of the delay taps provided by delay line 300 (i.e., the delay circuit may utilize a subset of the delay taps to provide up to N delayed output signals).

The plurality of delay taps in delay line 300 provide a number of variously delayed clock signals based upon input clock signal 302. For example, the first delay tap 306 provides a delayed clock signal that represents input clock signal 302 delayed by first delay buffer 304, while the last delay tap 308 provides another delayed clock signal that represents input clock signal 302 delayed by the combination of N delay buffers. In this manner, delay line 300 can be configured to generate up to N delayed clock signals, each being delayed by a different amount relative to input clock signal 302.

Referring again to FIG. 2, input delay element 206 generates a plurality of variously delayed clock signals based upon input clock signal 202, and reference delay element 208 generates a plurality of variously delayed clock signals based upon reference clock signal 218. A practical embodiment of digital delay circuit 200 utilizes a proper subset of the variously delayed input clock signals and a proper subset of the variously delayed reference clock signals. In this regard, input delay element 206 provides a number of variously delayed clock signals 222 (each based upon input clock signal 202) for use as inputs to selection circuit 210. Likewise, reference delay element 208 provides a number of variously delayed clock signals 224 (each based upon reference clock signal 218) for use as inputs to processing circuit 212. Accordingly, some or all of the delay taps of input delay element 206 are coupled (directly or indirectly) to selection circuit 210, and some or all of the delay taps of reference delay element 208 are coupled (directly or indirectly) to processing circuit 212.

Input delay element 206 and reference delay element 208 are suitably configured such that they have matching operational characteristics. As used herein, "matching operational characteristics" means that: (1) input delay element 206 and reference delay element 208 exhibit the same (within practical manufacturing and design tolerances) nominal delay per buffer; (2) in response to changes in environmental conditions (e.g., operating temperature and humidity), the variation in the actual delay per buffer of input delay element 206 tracks (within practical tolerances) the variation in the actual delay per buffer of reference delay element 208; and (3) in response to different device manufacturing processes, the variation in the actual delay per buffer of input delay element 206 tracks (within practical tolerances) the variation in the actual delay per buffer of reference delay element 208.

In a practical embodiment, the two delay elements are manufactured using the same device manufacturing processes. In addition, the two delay elements are typically manufactured using a single integrated circuit chip, thus ensuring consistency in the manufacturing process. Although not a requirement of the present invention, input delay element 206 and reference delay element 208 may include the same number of internal delay buffers and the same number of potentially available delay taps. As described above, however, the number of delay taps utilized for outputs and/or the specific delay taps selected to provide outputs will typically differ between input delay element 206 and reference delay element 208.

Figure 4:
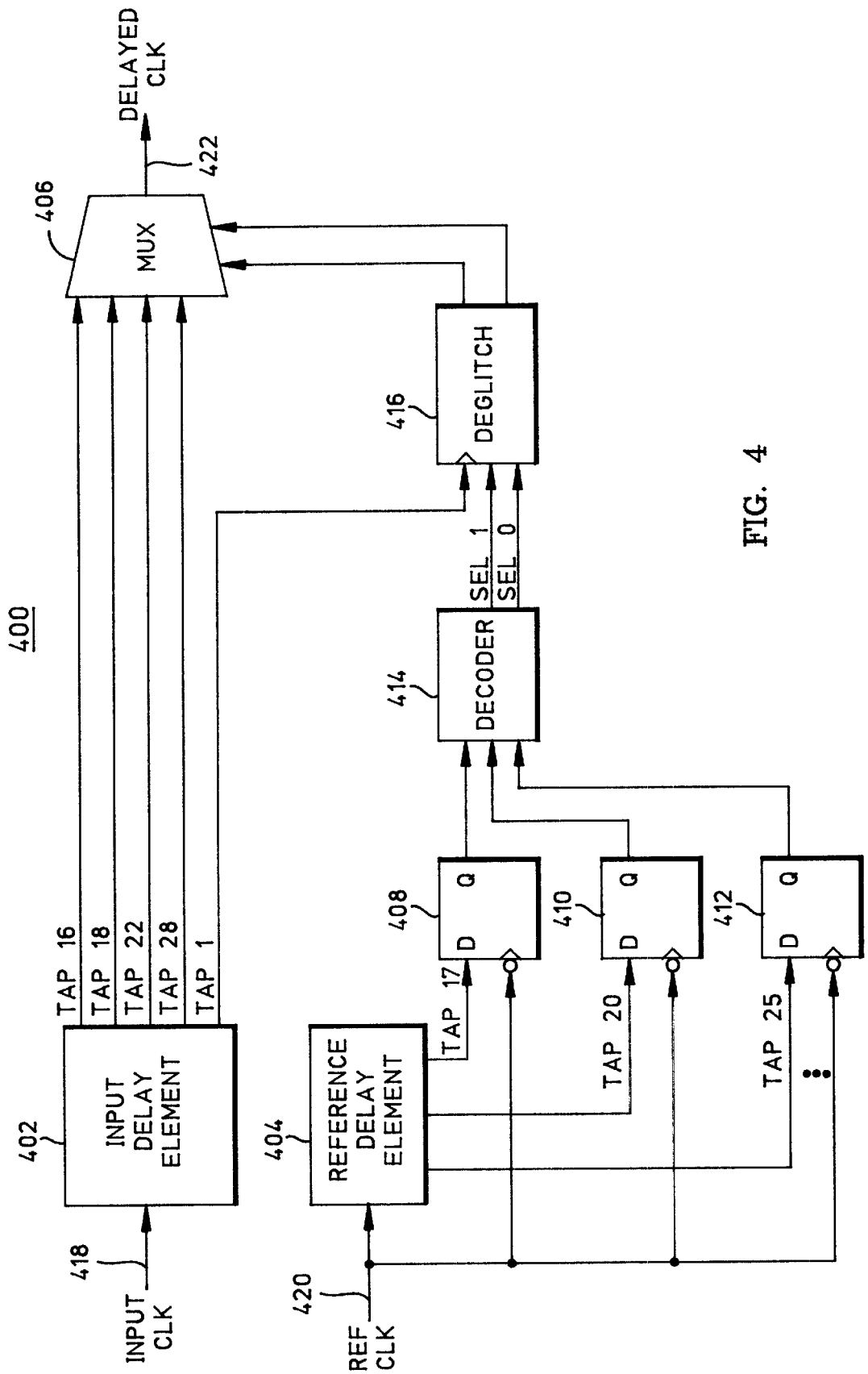
FIG. 4 is a schematic representation of a digital delay circuit configured in accordance with an example embodiment of the present invention.

FIG. 4 is a schematic representation of a digital delay circuit 400 configured in accordance with an example embodiment of the present invention. Circuit 400 represents one possible practical implementation of digital delay circuit 200, and will be described herein in the context of a specific numerical example of the present invention.

Digital delay circuit 400 generally includes an input delay element 402, a reference delay element 404, a selection component realized as a multiplexer 406, a sampling circuit realized as a plurality of flip flops 408/410/412, a digital decoder 414, and a deglitching circuit or component 416. Referring to FIG. 2, multiplexer 406 represents selection circuit 210, and the combination of flip flops 408/410/412, decoder 414, and deglitching circuit 416 represents processing circuit 212. Input delay element 402 receives an input clock signal 418, reference delay element 404 receives a reference clock signal 420, and multiplexer 406 outputs a delayed clock signal 422.

As described above in connection with delay line 300, input delay element 402 may include any number of delay buffers and any number of corresponding delay taps. Delay circuit 400, however, only utilizes a selected number of delay taps from input delay element 402, namely, tap one, tap sixteen, tap eighteen, tap twenty-two, and tap twenty-eight. The variously delayed representations of input clock signal 418 that appear on tap sixteen, tap eighteen, tap twenty-two, and tap twenty-eight serve as inputs to multiplexer 406, while the output of tap one serves as a clock signal for deglitching circuit 416. In the example embodiment, multiplexer 406 is suitably configured to select one of the variously delayed input clock signals (i.e., one of the four delay tap output signals) in response to information derived from the operation of reference delay element 404.

Reference clock signal 420 should be stable and precise over practical operating conditions and regardless of manufacturing process variations. In practical embodiments, reference clock signal 420 can be generated using an on-chip voltage controlled oscillator circuit (not shown). Reference clock signal 420 need not have any phase relationship with input clock signal 418. Although reference delay element 404 may also include any number of delay buffers and any number of corresponding delay taps, delay circuit 400 only utilizes a selected number of delay taps from reference delay element 404. In this regard, the variously delayed representations of reference clock signal 420 that appear on tap seventeen, tap twenty, and tap twenty-five serve as respective inputs to flip flops 408/410/412. As described in more detail below, these delayed clock outputs convey information identifying delay characteristics of reference delay element 404. Assuming that the operational characteristics of input delay element 402 match the operational characteristics of reference delay element 404, these outputs of reference delay element 404 also convey information regarding delay characteristics of input delay element 402. Specifically, reference clock signal 420 and the corresponding delayed reference clock signals can be utilized to determine the number of input delay line buffers needed to produce a specified propagation delay for input clock signal 418.

Flip flops 408/410/412 utilize reference clock signal 420 as a latching clock (in the example embodiment, the falling transition edge of reference clock signal 420 clocks flip flops 408/410/412). Accordingly, flip flops 408/410/412 function as a sampling circuit that samples the variously delayed reference clock signals (at the three selected delay taps) to obtain three sampled values.

The outputs of flip flops 408/410/412 are coupled (directly or indirectly) to decoder 414. Decoder 414 is suitably configured to receive the sampled values corresponding to the variously delayed output signals, and to generate one or more selection signals in response to the sampled values. The example embodiment shown in FIG. 4 utilizes a 3:2 bit decoder 414 that generates two selection signals in response to the three sampled values (in the example embodiment, the three-bit input to decoder 414 is utilized to identify only four distinct states; a number of three-bit input combinations represent "don't care" conditions). Decoder 414 may be realized using a look-up table, a state machine, or any number of known digital logic techniques.

The outputs of decoder 414 are coupled (directly or indirectly) to deglitching circuit 416. Deglitching circuit 416 may employ one or more flip flops (not shown) or other devices to ensure that the states of the selection signals to multiplexer 406 are stable during the transition of the tap outputs of input delay element 402 (taps 16, 18, 22, and 28 in this example). This ensures that delayed clock signal 422 is "glitch free." In this regard, deglitching circuit 416 is responsive to a rising edge of input clock signal 418 (in the example embodiment, deglitching circuit 416 is triggered by the rising edges of the delayed clock signal available at tap number one). Deglitching circuit 416 is coupled (directly or indirectly) to multiplexer 406 such that the deglitched selection signal outputs are provided to multiplexer 406. As described above, multiplexer 406 selects an appropriate output signal for use as delayed clock signal 422 in response to information (i.e., the selection bits) derived from the operation of reference delay element 404.

Figure 5:
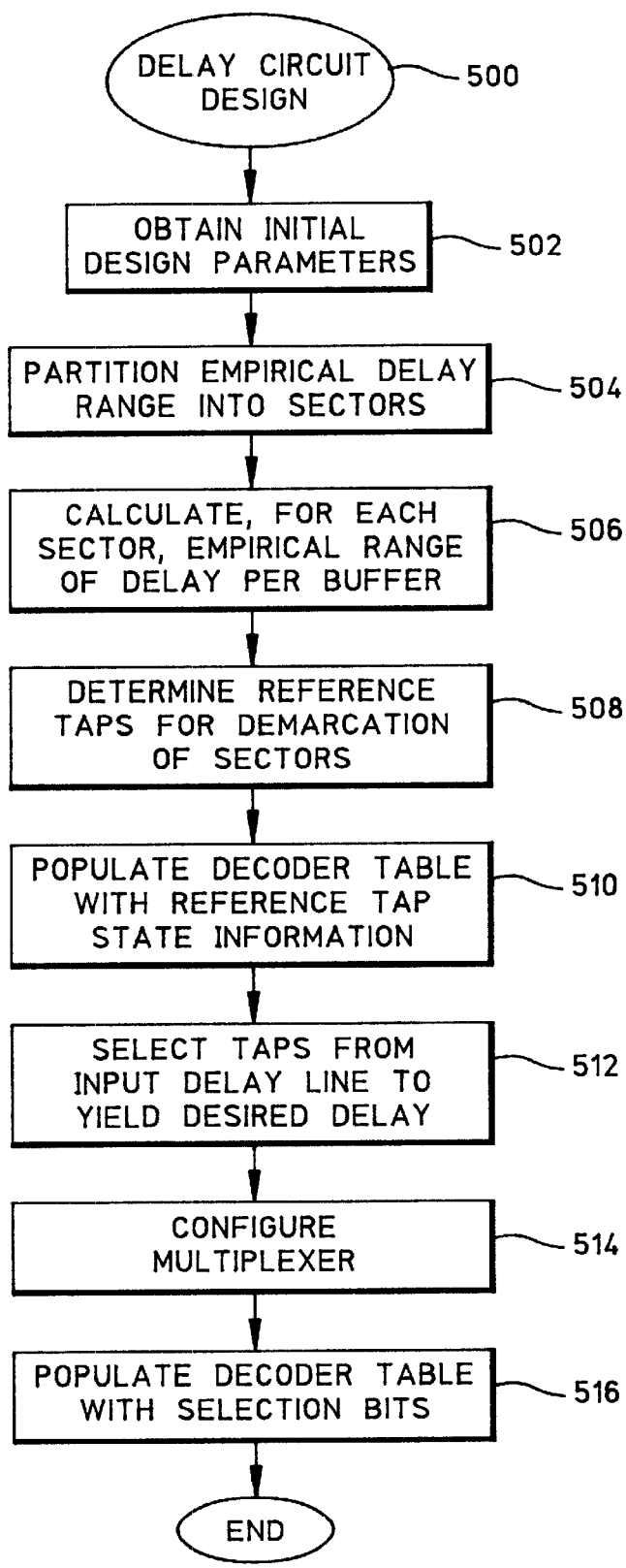
FIG. 5 is a flow diagram representing an example design process for a delay circuit according to the present invention.

In practice, a digital delay circuit according to the present invention is designed to accommodate a specified nominal clock delay and to compensate for variations in process and environmental conditions. The design of such a digital delay circuit involves the selection of delay taps from the input delay element and from the reference delay element. FIG. 5 is a flow diagram representing an example design process 500 for a delay circuit according to the present invention. Process 500 may be performed by hand and/or by a machine such as a calculator or a computer executing a suitable software application. Process 500 is consistent with the example embodiment described above in connection with FIG. 4. Process 500 may be performed to provide a digital delay circuit for delaying a digital clock signal by a nominal delay and within a specified tolerance.

Design process 500 begins by obtaining initial design parameters (task 502) related to the desired performance of the digital delay circuit. For example, the following, and possibly other, parameters may be obtained during task 502: the clock period; the desired nominal delay; the allowable range of actual delay values; the nominal delay per buffer; the number of delay buffers in the matched delay elements; and empirical delay characteristics of such delay elements. For the example embodiment, the bit period is 3.2 nanoseconds, the desired nominal delay is 800 picoseconds, the allowable range of delay is 700–900 picoseconds, the nominal delay per buffer is 40 picoseconds, the typical range of delay per buffer is 25–55 picoseconds, and the typical range of delay provided by a practical delay line designed to achieve the nominal delay (800 picoseconds) is 500–1100 picoseconds. The range of 500–1100 picoseconds is obtained through statistical empirical data collected under various operating conditions and/or for different device processes.

The empirical delay range is arbitrarily partitioned into a plurality of sectors (task 504), where each sector represents a different operating condition or characteristic relative to nominal operation of a delay element. The example embodiment contemplates four sectors and simply divides the empirical range into four equal sub-ranges: fast (500–650 picoseconds), moderately fast (650–800 picoseconds), moderately slow (800–950 picoseconds), and slow (950–1100 picoseconds), where the designations represent actual delay ranges. In this context, "fast" means that a delay line designed to provide a nominal delay will actually provide less than the nominal delay, and "slow" means that the delay line will actually provide more than the nominal delay. If more precision is desired, then the number of sectors can be increased such that the delay circuit can compensate for a higher number of operating conditions.

Next, the empirical range of propagation delay per buffer is calculated for each sector (task 506). This calculation is based upon the "ideal" tap number that would provide the nominal delay value. In the current example, the nominal desired delay is 800 picoseconds and the nominal delay per delay line buffer is 40 picoseconds. Thus, under ideal conditions, the output of delay tap twenty would provide a signal delayed by 800 picoseconds. The range of delay per buffer for each sector is calculated by dividing the empirical ranges determined in task 504 by the "ideal" tap number. The results of this calculation for the example embodiment are set forth in Table 1 below.

TABLE 1

Reference Delay Line Tap Selection

| SECTOR | DELAY TO TAP 20 | DELAY PER BUFFER | REFERENCE TAP |
| --- | --- | --- | --- |
| 1—Fast | 500–650 picoseconds | 25–32 picoseconds | 25 |
| 2—Moderately Fast | 650–800 picoseconds | 32–40 picoseconds | 20 |
| 3—Moderately Slow | 800–950 picoseconds | 40–47 picoseconds | 17 |
| 4—Slow | 950–1100 picoseconds | 47–55 picoseconds | — |

Using the delay per buffer values calculated during task 506, design process 500 determines the reference delay line taps that serve as the demarcation points of the various sectors (task 508). The determination of the demarcation taps is based upon the empirical delay per buffer ranges and the nominal design delay. For example, the demarcation between the "fast" sector and the "moderately fast" sector is represented by tap twenty-five of the reference delay line (800 picoseconds÷32 picoseconds≈25). Using this approach, the demarcation tap between the "moderately fast" sector and the "moderately slow" sector is tap 20 and the demarcation tap between the "moderately slow" sector and the "slow" sector is tap seventeen. The demarcation or reference taps for the example embodiment are identified in Table 1. Referring to FIG. 4, these demarcation taps are ultimately utilized to provide the variously delayed signals to flip flops 408/410/412. Notably, even though a practical reference delay element 404 may include more than 25 delay buffers and taps, digital delay circuit need only utilize three of the available tap outputs.

Figure 6:
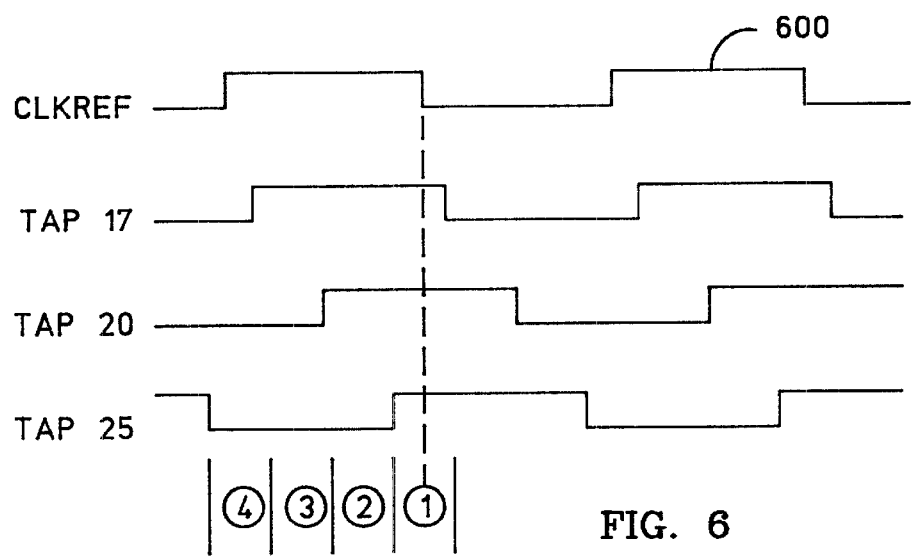
FIG. 6 is an example timing diagram of a reference clock signal and a number of tap output signals taken from a reference clock delay line element under fast operating conditions.
Figure 7:
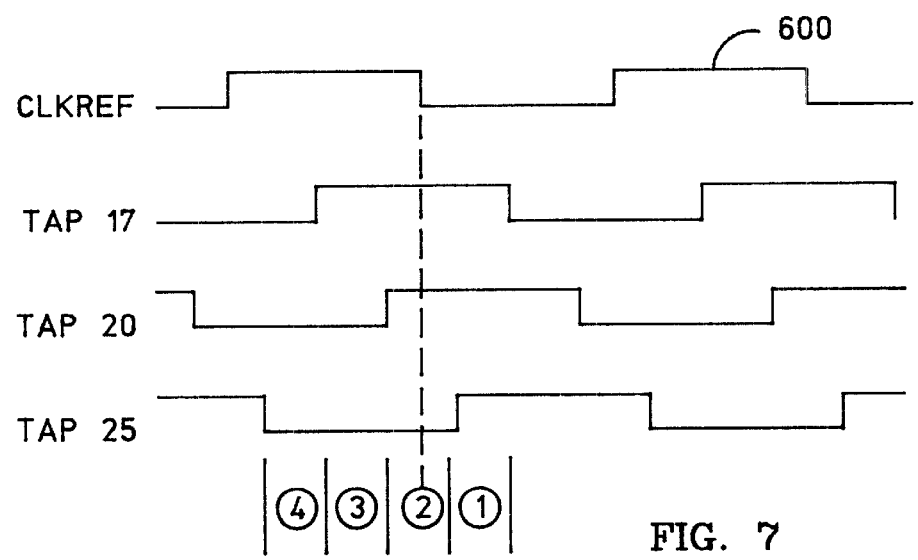
FIG. 7 is an example timing diagram of a reference clock signal and a number of tap output signals taken from a reference clock delay line element under moderately fast operating conditions.
Figure 8:
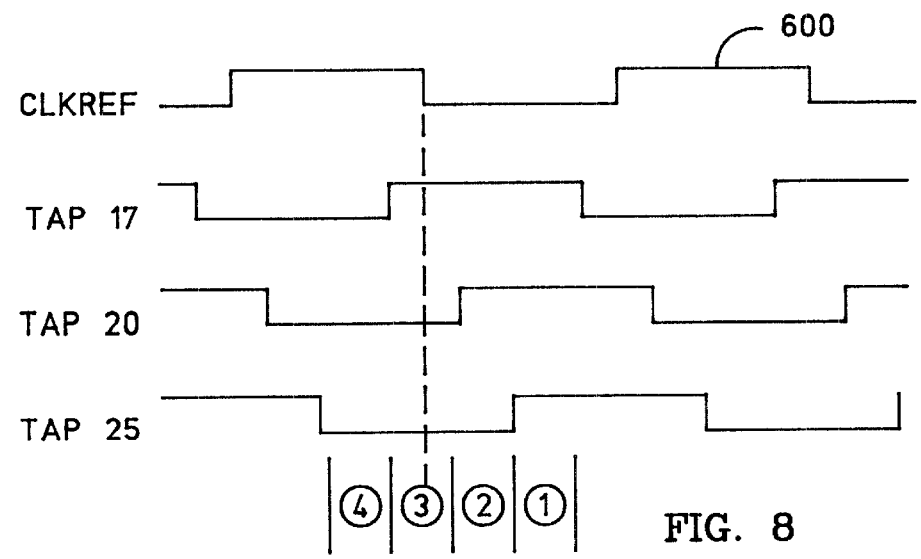
FIG. 8 is an example timing diagram of a reference clock signal and a number of tap output signals taken from a-reference clock delay line element under moderately slow operating conditions.
Figure 9:
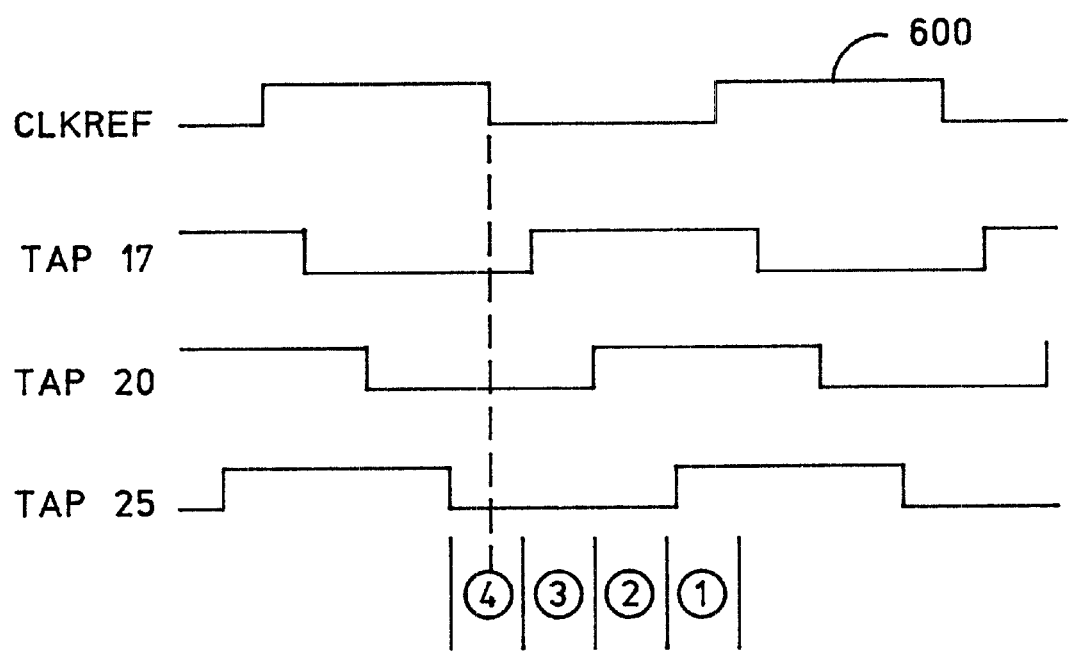
FIG. 9 is an example timing diagram of a reference clock signal and a number of tap output signals taken from a reference clock delay line element under slow operating conditions.

To better illustrate the concept of the sector demarcation points, FIG. 6 is an example timing diagram of a reference clock signal 600 and a number of tap output signals taken from a reference clock delay line element under fast operating conditions. FIGS. 7–9 are equivalent timing diagrams under moderately fast, moderately slow, and slow operating conditions, respectively. As mentioned previously, reference clock signal 600 is preferably generated by a precise and stable source such that reference clock signal 600 is substantially unaffected by variations in process and operating conditions. Accordingly, reference clock signal 600 is depicted as being consistent throughout FIGS. 6–9.

FIGS. 6–9 also depict delayed clock signals based upon reference clock signal 600; the delayed clock signals correspond to the outputs of taps seventeen, twenty, and twenty-five of the reference delay element. As described above, the selected delay taps are sampled with the falling transition edge of reference clock signal 600; the dashed vertical line in FIGS. 6–9 represents this sampling point. Under ideal and nominal conditions, the state of reference tap twenty will transition from low to high precisely at the falling edge of reference clock signal 600 (due to the stable 800 picosecond high time of reference clock signal 600 and the theoretical 800 picosecond delay associated with reference tap number twenty). If the current operating conditions are faster than nominal, however, then reference tap twenty will transition from low to high before the falling edge of reference clock signal 600 (as depicted in FIG. 6 and FIG. 7). Conversely, if the current operating conditions are slower than nominal, then reference tap twenty will transition from low to high after the falling edge of reference clock signal 600 (as depicted in FIG. 8 and FIG. 9).

In FIG. 6 (representing the "fast" sector), all three of the reference taps are high. Consequently, this state of the three reference taps (1, 1, 1) designates operation in the first or "fast" sector. In FIG. 7, (representing the "moderately fast" sector), reference tap twenty-five is low, while reference taps seventeen and twenty are high. Consequently, this state of the three reference taps (0, 1, 1) designates operation in the second or "moderately fast" sector. In FIG. 8, the (0, 0, 1) state designates operation in the third or "moderately slow" sector, and in FIG. 9, the (0, 0, 0) state designates operation in the fourth or "slow" sector. Notably, the number of demarcation points and the number of associated delay taps from the reference delay element can be increased if higher precision in the resulting delay is desired.

Referring back to FIG. 5, a task 510 may be performed to partially populate an decoder table with the reference tap state information. Table 2 depicts such an decoder table containing the example information. Using this approach, a subset of the reference delay line taps are selected such that variously delayed reference clock signals provided by the taps convey information identifying one of a plurality of operating conditions, namely, the speed of the reference delay line relative to a nominal speed.

TABLE 2

Partially Populated Decoder Table

| SECTOR | TAP 25 | TAP 20 | TAP 17 |
|---|---|---|---|
| Fast | 1 | 1 | 1 |
| Moderately Fast | 0 | 1 | 1 |
| Moderately Slow | 0 | 0 | 1 |
| Slow | 0 | 0 | 0 |

A subset of the taps from the input delay line are also suitably selected such that each of the taps provides a delayed input clock signal having an acceptable delay range corresponding to one of the plurality of operating conditions (task 512). For each sector, the determination performed during task 512 is based upon the empirical delay range per buffer for that sector (see task 506) and the tolerable range of actual delay (assumed to be 700–900 picoseconds in this example). For example, for the "fast" sector, tap twenty-eight yields a range of 700–896 picoseconds (25 picoseconds/buffer×28=700 picoseconds; 32 picoseconds/buffer×28=896 picoseconds), which falls within the desired range of 700–900 picoseconds. In this manner, the remaining three taps corresponding to the other three sectors are selected. Table 3 summarizes the results of this procedure.

Referring to FIG. 4, these four selected taps are utilized by delay circuit 400 to provide four variously delayed clock signals, each of which is based upon input clock signal 418, to multiplexer 406.

TABLE 3

Input Delay Line Tap Selection

| SECTOR | DELAY PER BUFFER | TAP | DELAY TO TAP |
|---|---|---|---|
| Fast | 25–32 picoseconds | 28 | 700–896 picoseconds |
| Moderately Fast | 32–40 picoseconds | 22 | 704–880 picoseconds |
| Moderately Slow | 40–47 picoseconds | 18 | 720–846 picoseconds |
| Slow | 47–55 picoseconds | 16 | 752–880 picoseconds |

After the taps from each delay line are determined, adjustments can be made for the clock tree (this will shorten the input delay line) and to compensate for setup and hold time differences of the data latches. For example, if the setup time is greater than the hold time, then the input delay line will be longer.

A task 514 may be performed to configure the selection circuit, e.g., a multiplexer, to accommodate the number of input signals and to provide a single output signal. In this example, the multiplexer receives four input signals and selects one of the four inputs to serve as the basis for the output signal. Accordingly, as shown in FIG. 4, the multiplexer receives two binary selection signals that serve to identify one of the four input signals. With this configuration in mind, the decoder table can be populated with the selection bit information, thus mapping each of the four operating states or sectors to one of the four combinations of the two selection bits. The completed decoder table is depicted in Table 4.

TABLE 4

Populated Decoder Table

| SECTOR | TAP 25 | TAP 20 | TAP 17 | SELECT BIT 1 | SELECT BIT 0 |
|---|---|---|---|---|---|
| Fast | 1 | 1 | 1 | 1 | 1 |
| Moderately Fast | 0 | 1 | 1 | 1 | 0 |
| Moderately Slow | 0 | 0 | 1 | 0 | 0 |
| Slow | 0 | 0 | 0 | 0 | 1 |

Of course, the particular mapping between the three decoder input bits and the two decoder output bits need not follow Table 4, and any number of alternate decoding schemes may be utilized by the decoder. After the appropriate input and reference taps are selected, the decoder is appropriately configured, and the multiplexer is appropriately configured, a delayed input clock signal corresponding to one of the input delay taps can be selected for use as the delayed clock signal output. In accordance with the techniques described herein, the delayed clock signal output will have an actual delay within the desired range (e.g., 700–900 picoseconds) regardless of process variations and changing environmental operating conditions.

Figure 10A:
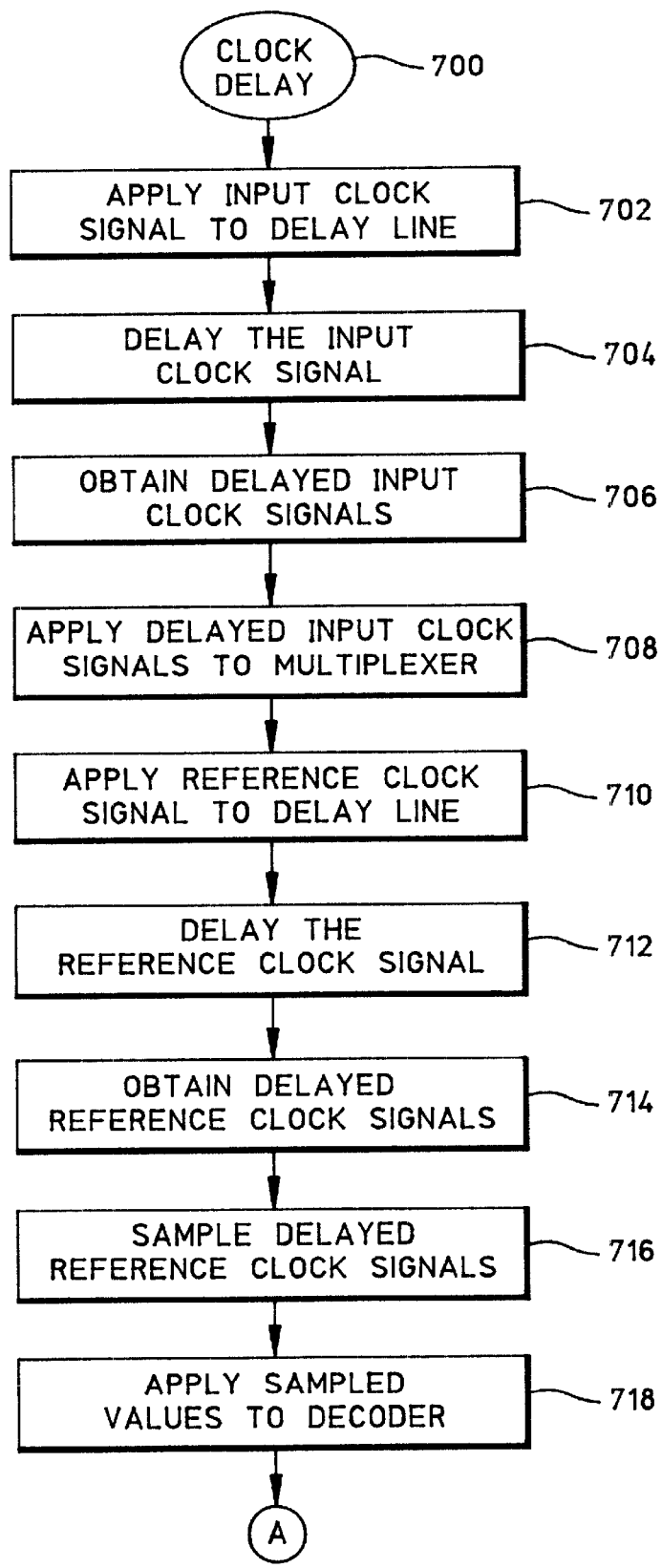
FIG. 10 is a flow diagram representing a clock delay process according to the present invention.
Figure 10B:
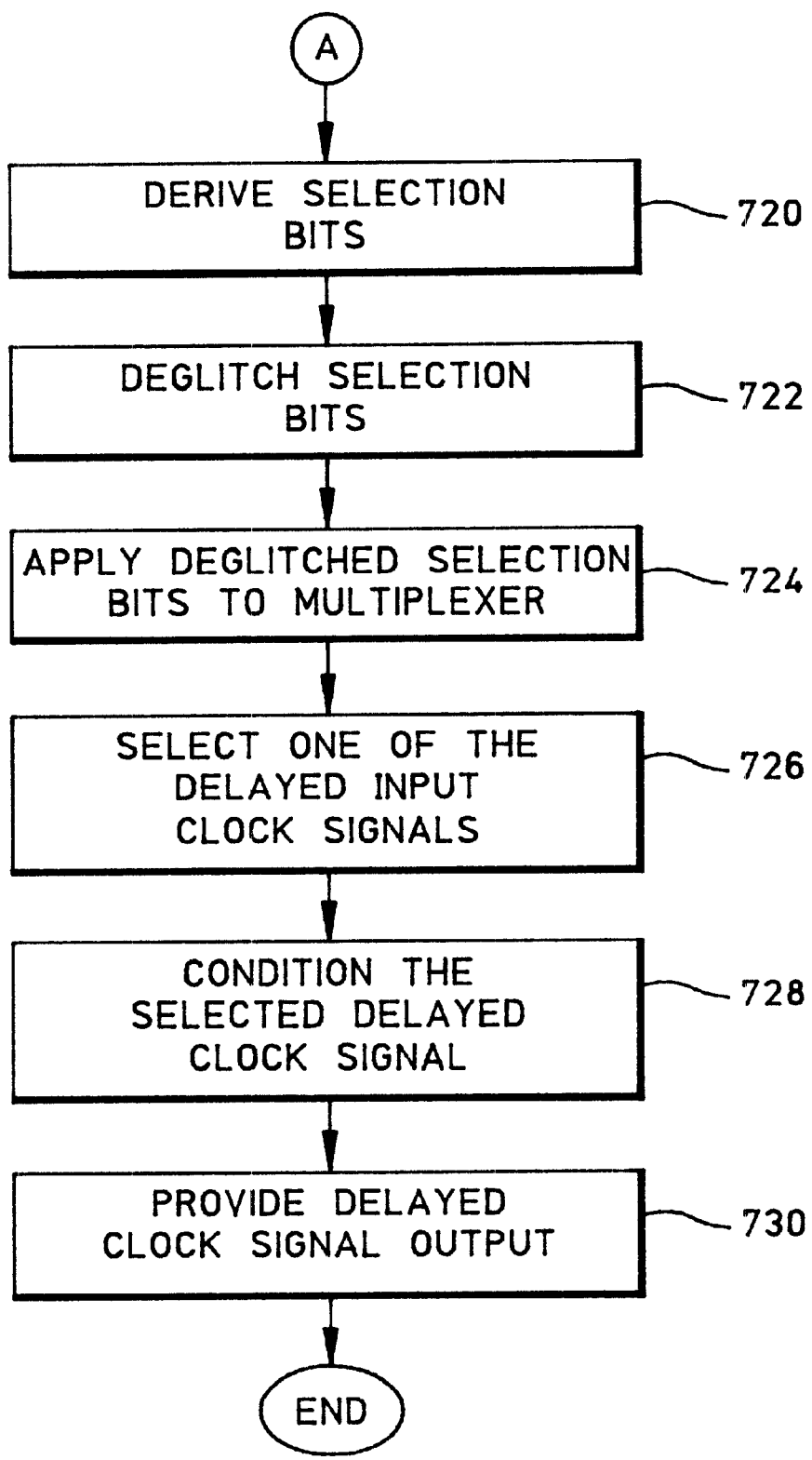

FIG. 10 is a flow diagram representing a clock delay process 700 according to the present invention. Clock delay process 700 may be performed by a digital delay circuit as described above. For consistency with the example embodiment, process 700 will be described with reference to delay circuit 400 and Tables 1–4.

Clock delay process 700 may begin by applying an input clock signal (obtained from an internal or external source) to the input delay line (task 702). The input delay line delays the input clock signal (task 704) in the manner described above in connection with delay element 300. Process 700 obtains a plurality of variously delayed input clock signals from the input delay line (task 706), where each of the delayed input clock signals is associated with a delay tap output of the input delay line. As described above, at least one of these delayed input clock signals exhibits an actual delay, relative to the input clock signal, that falls within an acceptable delay range corresponding to one of a plurality of operating conditions. In the example embodiment, the delayed input clock signals obtained during task 706 (or clock signals based upon the delayed input clock signals) are made available as inputs to a selection circuit such as multiplexer 406 (task 708).

Concurrently with the processing of the input clock signal, the delay circuit obtains a stable reference clock signal; the reference clock signal may be provided by an internal or external clock generator. In accordance with the preferred embodiment, the reference clock signal has a high (or low) time equal to the desired nominal delay time. Accordingly, for the example embodiment, the reference clock signal has a high time of 800 picoseconds, a period of 1600 picoseconds, and a 50% duty cycle. Of course, an alternate reference clock signal having a different period and duty cycle can be employed (assuming the specified high/ low time is maintained). Clock delay process 700 applies this reference clock signal to the reference delay line (task 710).

The reference delay line delays the reference clock signal (task 712) in the manner described above in connection with delay element 300. In this regard, clock delay process 700 obtains a plurality of variously delayed reference clock signals from the reference delay line (task 714), where each of the delayed reference clock signals is associated with a delay tap output of the reference delay line. As explained above, the variously delayed reference clock signals convey information identifying one of a plurality of operating conditions, e.g., the actual delay of the reference delay line relative to the nominal delay amount (the example embodiment refers to four relative "speeds" corresponding to the delay characteristics of the reference delay line). Consequently, the reference delay line is configured to provide empirical delay information that can be utilized to estimate the matching delay characteristics of the input delay line.

The delayed reference clock signals obtained during task 714 are sampled with an appropriately configured sampling circuit, such as a plurality of flip flops (task 716). The sampling of the delayed reference clock signals yields a plurality of sampled values (representing high or low states). In the example embodiment, each of the variously delayed reference clock signals is sampled at the same time and the sampling performed during task 716 is enabled by the reference clock signal. As depicted in FIG. 4, the example embodiment samples the delayed reference clock signals at the falling edge transition of the reference clock signal. Clock delay process 700 makes the sampled values available as inputs to decoder 414 (task 718), which derives selection bits from the sampled values (task 720). As mentioned above, these selection bits (or information based upon the selection bits) are eventually utilized as control inputs to multiplexer 406.

The delay circuit may deglitch the selection bits (task 722), utilizing deglitching circuit 416 and the input clock signal, to ensure that transitions in the selection bit states are stable relative to the timing of the input clock signal. The deglitched selection bits are applied to multiplexer 406 (task 724) to serve as the selection control signals. In response to the states of the selection bits, multiplexer 406 selects one of the delayed input clock signals (task 726) for use as a basis for a delayed clock signal output. In this regard, clock delay process 700 may perform an optional task 728, which suitably conditions or processes the delayed input clock signal (selected during task 726) for use as the delayed clock signal output. In other words, the delay circuit may further manipulate the selected delayed input clock signal before making it available for other purposes.

In the example embodiment shown in FIG. 4, the clock delay circuit utilizes the delayed input clock signal selected during task 726 as the delayed clock signal output (or otherwise makes the selected delayed input clock signal available for other purposes). Accordingly, task 730 provides a delayed clock signal output. Ultimately, the delayed clock signal output is based upon the original input clock signal, the original reference clock signal, the delayed reference clock signals, and the sampled values corresponding to the delayed reference clock signals. As mentioned above, the delayed clock signal output represents the original input clock signal delayed by approximately the specified nominal delay. In practice, the actual delay generated by the clock delay circuit will fall within the specified range of delay (700–900 picoseconds in the example embodiment). Notably, the clock delay circuit can select from among a plurality of variously delayed input clock signals to react, in substantially real-time, to changes in operating conditions that affect the performance of the delay line elements.

Figure 11:
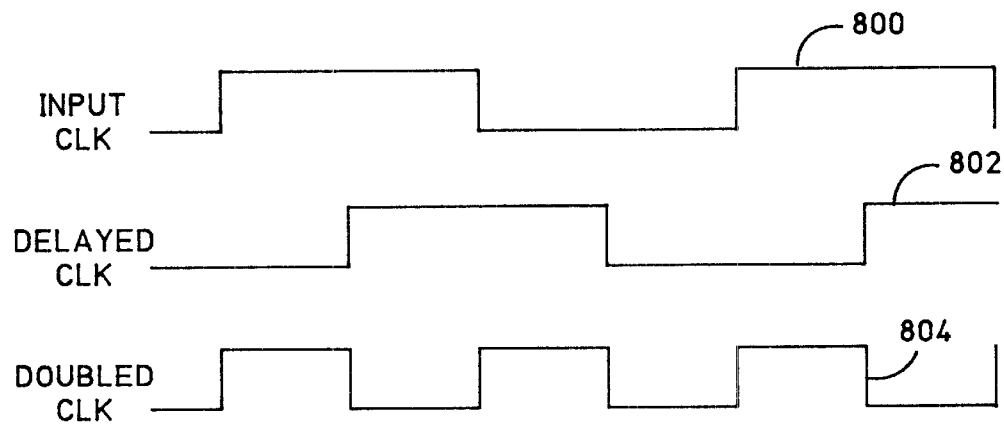
FIG. 11 is a timing diagram depicting an input clock signal, a delayed version of the input clock signal, and a frequency doubled clock signal derived from the input clock signal and the delayed clock signal.

A clock delay circuit as described above can be utilized in a digital frequency doubler circuit to ensure that the frequency doubled clock signal has a duty cycle that falls within a relatively precise range of values. In this context, FIG. 11 is a timing diagram depicting an input clock signal 800, a corresponding delayed clock signal 802, and a frequency doubled clock signal 804 derived from input clock signal 800 and delayed clock signal 802. Although not a requirement of the present invention, input clock signal 800 has a 50% duty cycle and a period of 3.2 nanoseconds. In this example, frequency doubled clock signal 804 should have a 50% duty cycle and a period of 1600 picoseconds. In a practical embodiment, frequency doubled clock signal 804 is generated by subjecting input clock signal 800 and delayed clock signal 802 to an XOR operation. For this reason, delayed clock signal 802 is ideally delayed by 800 picoseconds relative to input clock signal 800 (i.e., delayed by 25% of the period of input clock signal 800).

Figure 12:
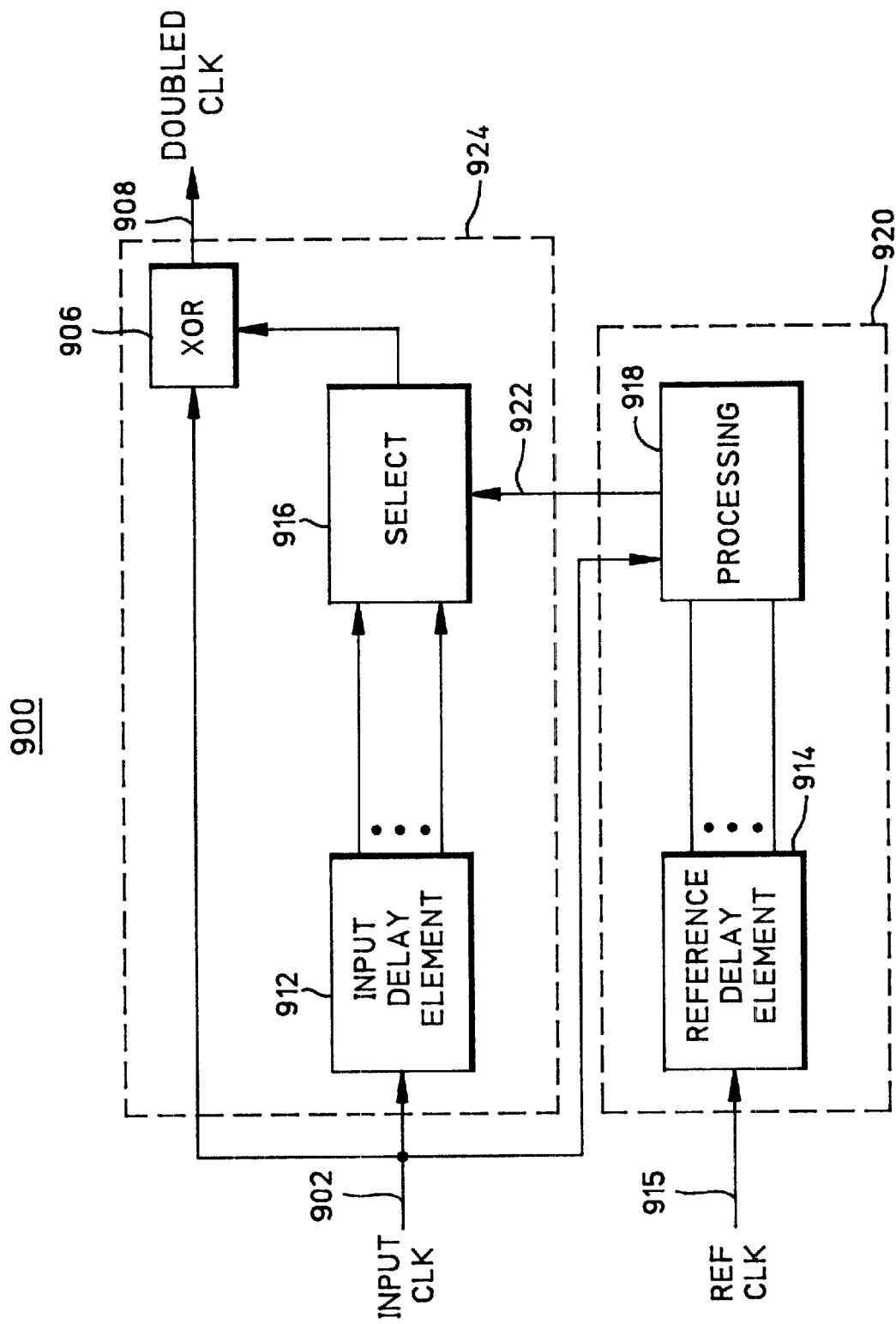
FIG. 12 is a schematic representation of a digital frequency doubler circuit configured in accordance with the present invention.

FIG. 12 is a schematic representation of a digital frequency doubler circuit 900 configured in accordance with the present invention. Circuit 900 receives an input clock signal 902 (from any suitable internal or external source), delays input clock signal 902, and produces a delayed clock signal 904 based upon input clock signal 902. Circuit 900 may utilize any suitable circuit or component configured to derive an output clock signal having a higher frequency than input clock signal 902. In the example embodiment, circuit 900 includes an XOR element 906 that performs an XOR operation on input clock signal 902 and delayed clock signal 904. As described above in connection with FIG. 11, the output of XOR element 906 is a doubled clock signal 908 representing a frequency doubled version of input clock signal 902.

Frequency doubler circuit 900 shares many features and aspects with digital delay circuit 200 and with digital delay circuit 400. Such common features will not be described in detail in the context of circuit 900. Consistent with delay circuit 200, frequency doubler circuit 900 includes an input delay element 912, a reference delay element 914 that receives a reference clock signal 915, a selection circuit or component 916, and a processing circuit or component 918. As shown in FIG. 12, input clock signal 902 (or a suitable clock signal based upon input clock signal 902) serves as one input to XOR element 906, while delayed clock signal 904 (or a suitable clock signal based upon delayed clock signal 904) serves as a second input to XOR element 906. Input clock signal 902 (or a suitable clock signal based upon input clock signal 902) may also serve as an input to processing circuit 918. In contrast to delay circuit 400 (see FIG. 4), which utilizes a delayed input clock signal for purposes of deglitching, processing circuit 918 utilizes input clock signal 902 for deglitching. Alternatively, frequency doubler circuit 900 may utilize a delayed input clock signal from one of the delay taps of input delay element 912 for purposes of deglitching.

The portion of frequency doubler circuit 900 comprising reference delay element 914 and processing circuit 918 is referred to herein as the master circuit 920. In this context, master circuit 920 receives reference clock signal 915 and input clock signal 902 as inputs, and generates one or more tap selection signals 922 as outputs. In a practical embodiment, tap selection signals 922 are utilized to control the operation of a multiplexer (as described above in connection with FIG. 4). The portion of frequency doubler circuit 900 comprising input delay element 912, selection circuit 916, and XOR element 906 are referred to herein as the slave circuit 924. In this context, slave circuit 924 receives input clock signal 902 and tap selection signals 922 as inputs, and generates doubled clock signal 908 as an output.

In the example embodiment, input clock signal 902 has a period of 3.2 nanoseconds and a 50% duty cycle, and (ideally) frequency doubled clock signal 908 has a period of 1600 picoseconds and a 50% duty cycle. Reference clock signal 915 has a period of 1600 picoseconds, a 50% duty cycle, and an 800 picosecond high time. Using the clock delay techniques described above, delayed clock signal 904 will be nominally delayed by 800 picoseconds, and the resulting frequency doubled clock signal 908 will have a high time that approximates the high time of reference clock signal 915 (800 picoseconds in this example).

Referring again to FIG. 10, frequency doubler circuit 900 may perform clock delay process 700 while generating frequency doubled clock signal 908. In the context of an example frequency doubling process, task 730 provides the delayed clock signal to an XOR element, which also receives the original input clock signal as a second input. In accordance with conventional digital logic techniques, the XOR element performs an XOR operation on the input clock signal and the delayed clock signal to derive a frequency doubled output clock signal. In alternate embodiments, a similar process can be performed to alter the frequency of the input clock signal by any desired amount. As described above, the period, duty cycle, and/or high time of the specified input and reference clock signals will determine the operation of the circuit.

Figure 13:
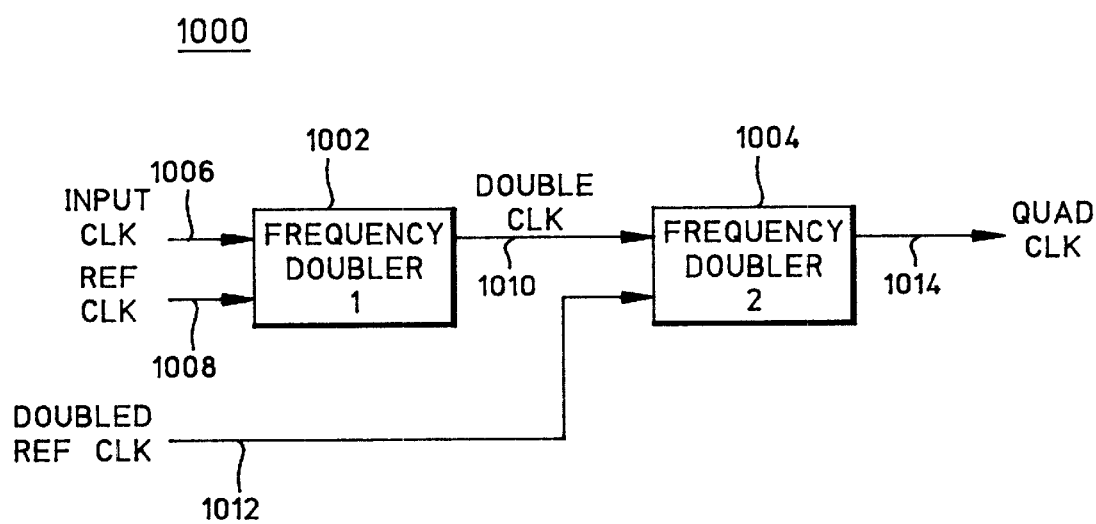
FIG. 13 is a schematic representation of a digital circuit employing two cascaded frequency doubler circuits.

A frequency doubler circuit according to the present invention can be cascaded to generate higher frequency multiples of the original input clock signal. FIG. 13 is a schematic representation of a digital circuit 1000 employing two cascaded frequency doubler circuits. Circuit 1000 includes a first frequency doubler circuit 1002 coupled (directly or indirectly) to a second frequency doubler circuit 1004. Each frequency doubler circuit 1002/1004 may be configured as described above in connection with frequency doubler circuit 900. Frequency doubler circuit 1002 receives an input clock signal 1006 and a reference clock signal 1008, and generates a frequency doubled clock signal 1010 based upon input clock signal 1006. Frequency doubled clock signal 1010 serves as an input to frequency doubler circuit 1004, which also receives a second reference clock signal 1012 as an input. Second reference clock signal 1012 represents a frequency doubled version of reference clock signal 1008. For the example embodiment, frequency doubled clock signal 1010 has a period of 1600 picoseconds and a 50% duty cycle, while second reference clock signal 1012 has a period of 800 picoseconds, a 50% duty cycle, and a 400 picosecond high time.

Second frequency doubler circuit 1004 is suitably configured to generate a frequency quadrupled clock signal 1014 (relative to input clock signal 1006) based upon frequency doubled clock signal 1010. In a practical embodiment, the same general design is used for both frequency doubler circuits 1002/1004. Each frequency doubler circuit, however, is configured to accommodate the frequency of its respective input clock signal. In other words, first frequency doubler circuit 1002 is suitably configured to double the frequency of original input clock signal 1006, and second frequency doubler circuit 1004 is suitably configured to double the frequency of clock signal 1010. In this regard, the delay line elements utilized by second frequency doubler circuit 1004 may (but need not) be only be half as long as the delay line elements utilized by first frequency doubler circuit 1002.

Figure 14:
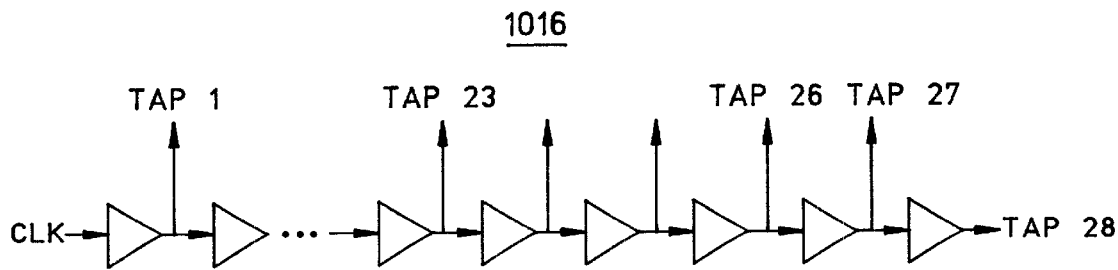
FIG. 14 is a schematic representation of a delay line element that may be utilized by the first frequency doubler circuit shown in FIG. 13.
Figure 15:
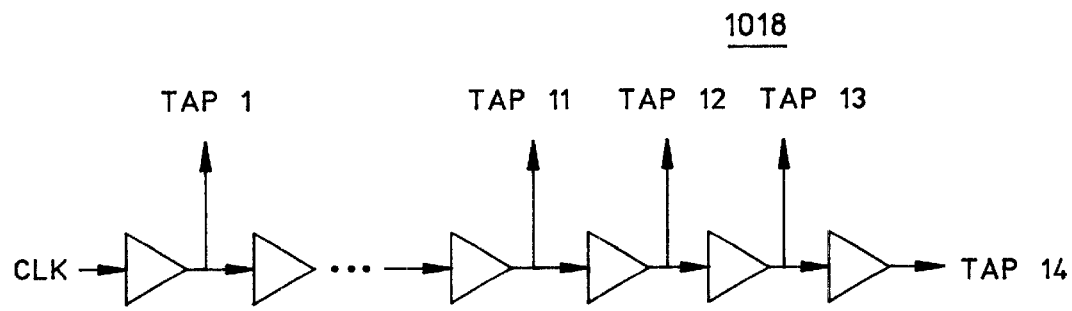
FIG. 15 is a schematic representation of a delay line element that may be utilized by the second frequency doubler circuit shown in FIG. 13.

FIG. 14 is a schematic representation of a delay line element 1016 that may be utilized by first frequency doubler circuit 1002, and FIG. 15 is a schematic representation of a delay line element 1018 that may be utilized by second frequency doubler circuit 1004. In practical embodiments, the input and reference delay elements in frequency doubler circuit 1002 are matched and the input and reference delay elements in frequency doubler circuit 1004 are matched. As described above in connection with FIG. 3, the input and reference delay elements are each realized as a digital delay line. Consistent with the example embodiment, delay line 1016 includes at least 28 delay buffers connected in series. As described above, although the 28 delay tap outputs can potentially provide 28 variously delayed clock signals, a limited number of delay tap outputs are actually utilized. In contrast to delay line 1016, delay line 1018 may include only 14 delay buffers (i.e., delay line 1018 need not be longer than one-half the length of delay line 1016). The shortened length of delay line 1018 results from the cascaded configuration of circuit 1000 and the use of frequency doubled reference clock signal 1012 as the reference input to second frequency doubler circuit 1004.

In the example embodiment, frequency doubler circuit 1002 will select a delay tap output (from its input delay element) corresponding to a delay of 800 picoseconds, while frequency doubler circuit 1004 will select a delay tap output (from its input delay element) corresponding to a delay of 400 picoseconds. Consequently, frequency doubler circuit 1002 will select its output signal from a subset of "higher numbered" delay tap outputs and frequency doubler circuit 1004 will select its output signal from a subset of "lower numbered" delay tap outputs.

Theoretically, the cascading concept depicted in FIG. 13 can be expanded to include any number of frequency doublers connected in series. In a working implementation, however, the number of cascaded frequency doublers may be limited by practical characteristics of the circuit components. To accommodate such expansion, additional reference clock signals and shorter (faster) delay line elements may need to be implemented.

Figure 16:
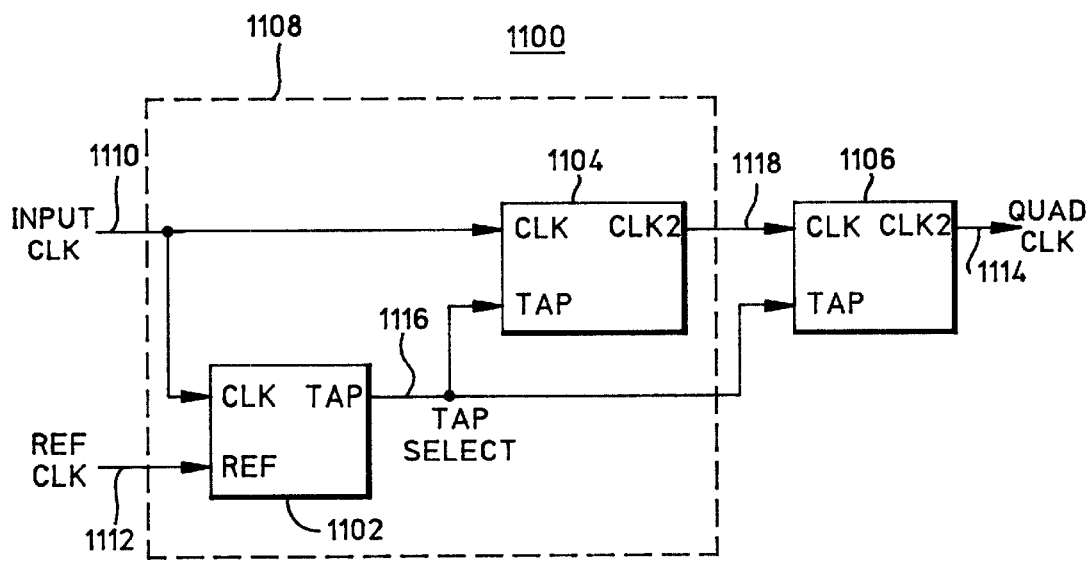
FIG. 16 is a schematic representation of a digital circuit for quadrupling the frequency of a clock signal.

FIG. 16 is a schematic representation of another digital circuit 1100 for quadrupling the frequency of a clock signal. Circuit 1100 includes one master circuit 1102 and two slave circuits 1104/1106, as defined above in connection with circuit 900 (see FIG. 12). In this regard, circuit 1100 utilizes master circuit 1102 as a common indicator of the delay characteristics of both slave circuit delay lines. As identified in FIG. 16, master circuit 1102 and slave circuit 1104 form a frequency doubler circuit 1108. Briefly, circuit 1100 receives an input clock signal 1110 and a reference clock signal 1112 as inputs, and generates a frequency quadrupled clock signal 1114 as an output.

Master circuit 1102 receives input clock signal 1110 and reference clock signal 1112 as inputs, and produces one or more tap selection signals 1116 as outputs. Tap selection signals 1116 are utilized as inputs to slave circuit 1104, along with input clock signal 1110. In the manner described above in connection with circuit 900, slave circuit 1104 generates a frequency doubled clock signal 1118 based upon input clock signal 1110. In this regard, the operation of frequency doubler circuit 1108 is identical to the operation of frequency doubler circuit 900. Accordingly, master circuit 1102 and slave circuit 1104 preferably utilize matching delay line elements. In the example embodiment, master circuit 1102 and slave circuit 1104 utilize delay line 1016 (see FIG. 14) or an equivalent thereof.

Slave circuit 1106 receives frequency doubled clock signal 1118 (or a signal based upon clock signal 1118) and tap selection signals 1116 as inputs, and generates frequency quadrupled clock signal 1114 in response to clock signal 1118. As described above in connection with circuit 1000, the length of the delay line used by slave circuit 1106 need only be one-half the length of the delay line used by slave circuit 1104. In this regard, slave circuit 1106 may utilize delay line 1018 (see FIG. 15) or an equivalent thereof.

The subset of delay line tap outputs from slave circuit 1104 and the subset of delay line tap outputs from slave circuit 1106 are independently selected according to the desired operation of circuit 1100. Thus, although the ultimate selection of the slave circuit output signals is based on common tap selection signals, the two slave circuits 1104/1106 can (and typically do) select different respective delay tap output signals. In the example embodiment, slave circuit 1104 will select a delay tap output corresponding to a delay of 800 picoseconds, while slave circuit 1106 will select a delay tap output corresponding to a delay of 400 picoseconds. Consequently, slave circuit 1106 will select its output signal from a subset of "lower numbered" delay tap outputs and slave circuit 1104 will select its output signal from a subset of "higher numbered" delay tap outputs.

Theoretically, the cascading concept depicted in FIG. 16 can be expanded to include any number of frequency doublers connected in series. In a working implementation, however, the number of cascaded frequency doublers may be limited by practical characteristics of the circuit components. To accommodate such expansion, additional reference clock signals and shorter (faster) delay line elements may need to be implemented.

The present invention has been described above with reference to a preferred embodiment. However, those skilled in the art having read this disclosure will recognize that changes and modifications may be made to the preferred embodiment without departing from the scope of the present invention. For example, the techniques described herein can be extended for use with alternate embodiments that utilize more or less than four sectors, different nominal delay values, any number of buffers per delay line, etc. These and other changes or modifications are intended to be included within the scope of the present invention, as expressed in the following claims.

What is claimed is:

1. A method for altering the frequency of a digital clock signal comprising:

delaying a reference clock signal;

obtaining a plurality of variously delayed reference clock signals in response to said delaying step;

sampling said plurality of variously delayed reference clock signals to obtain a plurality of sampled values;

generating a delayed clock signal based upon an input clock signal and based upon said plurality of sampled values; and deriving an output clock signal from said delayed clock signal and said input clock signal, said output clock signal having a higher frequency than said input clock signal.

2. A method according to claim 1, wherein:

said reference clock signal has a high/low time equal to a nominal delay; and said delayed clock signal represents said input clock signal delayed by approximately said nominal delay.

3. A method according to claim 1, wherein deriving said output clock signal comprises performing an XOR operation on said input clock signal and said delayed clock signal.

4. A method according to claim 3, wherein:

said input clock signal has a 50 percent duty cycle;

said delayed clock signal represents said input clock signal delayed by 25 percent and the frequency of said output clock signal is approximately double the frequency of said input clock signal.

5. A method according to claim 1, wherein:

said delaying step is performed by a reference delay element having a plurality of delay buffers and a plurality of delay taps corresponding to said plurality of delay buffers; and said obtaining step obtains said plurality of variously delayed reference clock signals from a subset of said plurality of delay taps.

6. A method according to claim 1, wherein generating said delayed clock signal comprises:

delaying said input clock signal with an input delay element having a plurality of delay buffers and a plurality of delay taps corresponding to said plurality of delay buffers;

obtaining a plurality of variously delayed input clock signals from a subset of said plurality of delay taps; and selecting one of said variously delayed input clock signals in response to said plurality of sampled values.

7. A method for altering the frequency of a digital clock signal comprising.

delaying an input clock signal with an input delay element having a plurality of input delay buffers and a number of input delay taps corresponding to a number of said input delay buffers, each of said number of input delay taps providing a respective delayed input clock signal having an acceptable delay range corresponding to one of a plurality of operating conditions providing a reference clock signal to a reference delay element having a plurality of reference delay buffers and a number of reference delay taps corresponding to a number of said reference delay buffers, said number of reference delay taps providing a number of variously delayed reference clock signals that convey information identifying one of said operating conditions sampling said reference delay taps at a transition of said reference clock signal to obtain a plurality of sampled values;

selecting, in response to said variously delayed reference clock signals, a delayed input clock signal corresponding to one of said input delay tars as a basis for a delayed clock signal output; and deriving an output clock signal from said delayed clock signal output and said input clock signal, said output clock signal having a higher frequency than said input clock signal.

8. A method according to claim 7, wherein selecting said delayed input clock signal is responsive to said sampled values.

9. A method according to claim 8, wherein:

selecting said delayed input clock signal is performed by a multiplexer; and said method further comprises deriving selection bits for said multiplexer from said plurality of sampled values.

10. A method according to claim 7, wherein deriving said output clock signal comprises performing an XOR operation on said input clock signal and said delayed clock signal output.

11. A method according to claim 10, wherein:

said input clock signal has a 50 percent duty cycle;

said delayed clock signal output represents said input clock signal delayed by 25 percent; and the frequency of said output clock signal is approximately double the frequency of said input clock signal.

12. A digital circuit comprising:

a reference delay element having an input for receiving a reference clock signal, said reference delay element being configured to Provide information identifying delay characteristics of said reference delay element;

an input delay element having an input for receiving an input clock signal, said input delay element and said reference delay element having matching operational characteristics, said input delay element being configured to provide a plurality of variously delayed input clock signals based upon said input clock signal;

a selection component, coupled to said input delay element and to said reference delay element, configured to select one of said variously delayed input clock signals as a delayed clock signal output in response to said information: and an XOR element configured to derive an output clock signal from said delayed clock signal output and said input clock signal, said output clock signal having a higher frequency than said input clock signal; wherein: said reference delay element comprises a plurality of delay buffers and a plurality of delay taps corresponding to said plurality of delay buffers; and a subset of said plurality of delay taps provide said number of output signals.

13. A digital circuit comprising:

a reference delay element having an input for receiving a reference clock signal, said reference delay element being configured to provide information identifying delay characteristics of said reference delay element;

an input delay element having an input for receiving an input clock signal, said input delay element and said reference delay element having matching operational characteristics, said input delay element being configured to provide a plurality of variously delayed input clock signals based upon said input clock signal;

a selection component, coupled to said input delay element and to said reference delay element, configured to select one of said variously delayed input clock signals as a delayed clock signal output in response to said information; and an XOR element configured to derive an output clock signal from said delayed clock signal output and said input clock signal, said output clock signal having a higher frequency than said input clock signal, wherein said reference delay element is configured to provide a number of output-signals that convey said information.

14. A digital circuit according to claim 13, further comprising a processing circuit, coupled to said reference delay element, configured to:

receive said output signals;

generate selection signals in response to said output signals; and provide said selection signals to said selection component for use in selecting said one of said variously delayed input clock signals.

15. A digital circuit according to claim 14, wherein said selection component comprises a multiplexer.

16. A digital circuit according to claim 15, wherein said processing circuit comprises a digital decoder.

17. A digital circuit according to claim 13, wherein:

said input clock signal has a 50 percent duty cycle;

said delayed clock signal output represents said input clock signal delayed by 25 percent; and the frequency of said output clock signal is approximately double the frequency of said input clock signal.

18. A digital circuit according to claim 13, wherein:

said input delay element comprises a plurality of delay buffers and a plurality of delay taps corresponding to said plurality of delay buffers; and a subset of said plurality of delay taps provide said plurality of variously delayed input clock signals.

19. A digital circuit comprising:

an input delay element comprising an input for receiving an input clock signal, a plurality of input delay buffers, and a number of delay tap outputs corresponding to a subset of said plurality of input delay buffers, said delay tap outputs providing a number of variously delayed input clock signals based upon said input clock signal;

a reference delay element comprising an input for receiving a reference clock signal, a plurality of reference delay buffers, and a number of reference delay tap outputs corresponding to a subset of said plurality of reference delay buffers;

a sampling circuit coupled to said reference delay element, said sampling circuit being configured to sample output signals at said reference delay tap outputs to obtain a plurality of sampled values;

a selection circuit coupled to said sampling circuit and to said number of delay tap outputs, said selection circuit being configured to select one of said variously delayed input clock signals as a delayed clock signal output in response to said plurality of sampled values; and an XOR element configured to derive an output clock signal from said delayed clock signal output and said input clock signal, said output clock signal having a higher frequency than said input clock signal.

20. A digital circuit according to claim 19, wherein:

said input clock signal has a 50 percent duty cycle;

said delayed clock signal output represents said input clock signal delayed by 25 percent; and the frequency of said output clock signal is approximately double the frequency of said input clock signal.

21. A digital circuit according to claim 19, wherein said selection circuit comprises a multiplexer, coupled to said number of delay tap outputs, configured to select one of said variously delayed input clock signals in response to a number of selection signals.

22. A digital circuit according to claim 21, further comprising a digital decoder, coupled to said sampling circuit, configured to:

receive said sampled values;

generate said selection signals in response to said sampled values; and provide said selection signals to said multiplexer.

23. A digital circuit according to claim 19, wherein said sampling circuit samples said output signals at a transition of said reference clock signal.

* * * * *